(12) United States Patent
Guo

(10) Patent No.: US 9,095,055 B2
(45) Date of Patent: Jul. 28, 2015

(54) ELECTRONIC DEVICE HAVING EXTENDABLE AND RETRACTABLE SLIDING MEMBER

(71) Applicants: Fu Tai Hua Industry (Shenzhen) Co., Ltd., Shenzhen (CN); HON HAI PRECISION INDUSTRY CO., LTD., New Taipei (TW)

(72) Inventor: Ji-Bing Guo, Shenzhen (CN)

(73) Assignees: Fu Tai Hua Industry (Shenzhen) Co., Ltd., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 92 days.

(21) Appl. No.: 13/726,590

(22) Filed: Dec. 25, 2012

(65) Prior Publication Data

US 2013/0163162 A1 Jun. 27, 2013

(30) Foreign Application Priority Data

Dec. 27, 2011 (CN) .......................... 2011 1 0443306

(51) Int. Cl.
G06F 1/16 (2006.01)
H05K 5/00 (2006.01)
H05K 7/00 (2006.01)
H05K 5/02 (2006.01)
G11B 17/056 (2006.01)

(52) U.S. Cl.
CPC ............ *H05K 5/0217* (2013.01); *G11B 17/056* (2013.01)

(58) Field of Classification Search
None
See application file for complete search history.

(56) References Cited

U.S. PATENT DOCUMENTS

| 4,561,085 | A | * | 12/1985 | Funabashi | ...................... 720/607 |
| 5,752,757 | A | * | 5/1998 | Choi | .......................... 312/319.1 |
| 6,411,505 | B1 | * | 6/2002 | DiFonzo et al. | ......... 361/679.38 |
| 7,170,743 | B2 | * | 1/2007 | Shimada et al. | ......... 361/679.37 |
| 7,869,207 | B2 | * | 1/2011 | Zhang et al. | ............. 361/679.55 |
| 8,026,451 | B2 | * | 9/2011 | Lai | ................. 174/542 |
| 8,534,918 | B2 | * | 9/2013 | Hsu et al. | ........................ 384/26 |
| 8,553,406 | B2 | * | 10/2013 | Liu et al. | ................. 361/679.39 |
| 8,582,286 | B2 | * | 11/2013 | Ulrich | ....................... 361/679.33 |
| 2002/0154477 | A1 | * | 10/2002 | Fukasawa | ...................... 361/685 |
| 2003/0222644 | A1 | * | 12/2003 | Okuma et al. | ........... 324/207.25 |
| 2003/0235032 | A1 | * | 12/2003 | Lee | ................. 361/685 |
| 2005/0111178 | A1 | * | 5/2005 | Bradley et al. | ................ 361/684 |
| 2005/0185375 | A1 | * | 8/2005 | Ito | ................. 361/685 |
| 2005/0257232 | A1 | * | 11/2005 | Hidaka | ......................... 720/654 |
| 2006/0092604 | A1 | * | 5/2006 | Ting | ........................ 361/684 |
| 2007/0139877 | A1 | * | 6/2007 | Kato | ............................ 361/683 |
| 2007/0279847 | A1 | * | 12/2007 | Li et al. | ......................... 361/679 |
| 2008/0151483 | A1 | * | 6/2008 | Holbrook et al. | ............. 361/681 |
| 2008/0186624 | A1 | * | 8/2008 | Chuang et al. | ............. 360/99.06 |
| 2009/0323278 | A1 | * | 12/2009 | Lu | ............................ 361/679.55 |
| 2010/0022286 | A1 | * | 1/2010 | Wang et al. | ................. 455/575.4 |
| 2010/0031468 | A1 | * | 2/2010 | Tomiji et al. | ...................... 16/52 |
| 2012/0026654 | A1 | * | 2/2012 | Ou et al. | .................. 361/679.01 |
| 2013/0155584 | A1 | * | 6/2013 | Chen | ......................... 361/679.01 |

* cited by examiner

*Primary Examiner* — Hoa C Nguyen
*Assistant Examiner* — Xanthia C Cunningham
(74) *Attorney, Agent, or Firm* — Novak Druce Connolly Bove + Quigg LLP

(57) ABSTRACT

An exemplary electronic device includes a shell, a sliding member movably received in the shell, and a movement driver. The driving mechanism includes a link lever, a pusher and a position stopper. The position stopper is located to a rear end of the link lever, and the pusher is latched by the position stopper when the sliding member is received in the shell. The link lever controls the position stopper to release the pusher, and the pusher ejects the sliding member out from the shell.

18 Claims, 8 Drawing Sheets

ELECTRONIC DEVICE HAVING EXTENDABLE AND RETRACTABLE SLIDING MEMBER

BACKGROUND

1. Technical Field

The present disclosure relates to an electronic device having a shell and a sliding member, with the sliding member extendable out from and retractable back into the shell.

2. Description of Related Art

Many electronic devices include certain supplementary function elements for providing additional features or utility. The supplementary function elements may include buttons, indicator lights, and so on, and are normally fixed onto a surface of the electronic device. However, when the supplementary functions are not being used, the supplementary function elements still take up valuable space on the surface of the electronic device. This makes miniaturization of the electronic device problematic.

What is needed is a means that can overcome the above-described limitations. Moreover, for certain electronic devices, there is a need for one part of the electronic device to be accessible when required and conveniently stowable when not required.

BRIEF DESCRIPTION OF THE DRAWINGS

The components in the drawings are not necessarily drawn to scale, the emphasis instead placed upon clearly illustrating the principles of at least one embodiment. In the drawings, like reference numerals designate corresponding parts throughout the various views, and all the views are schematic.

DETAILED DESCRIPTION

Reference will be made to the drawings to describe certain exemplary embodiments of the present disclosure.

Figure 1:
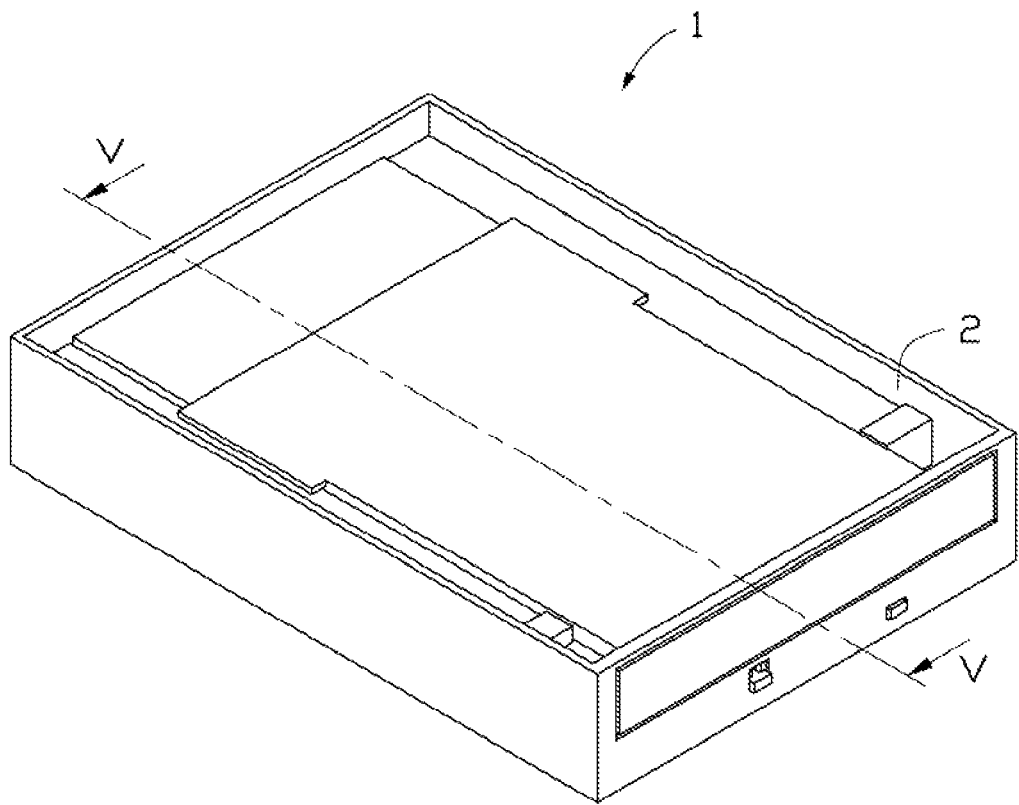
FIG. 1 is an isometric view of an electronic device according to an embodiment of the present disclosure, the electronic device including a shell and a sliding member, and showing the sliding member received in the shell.
Figure 2:
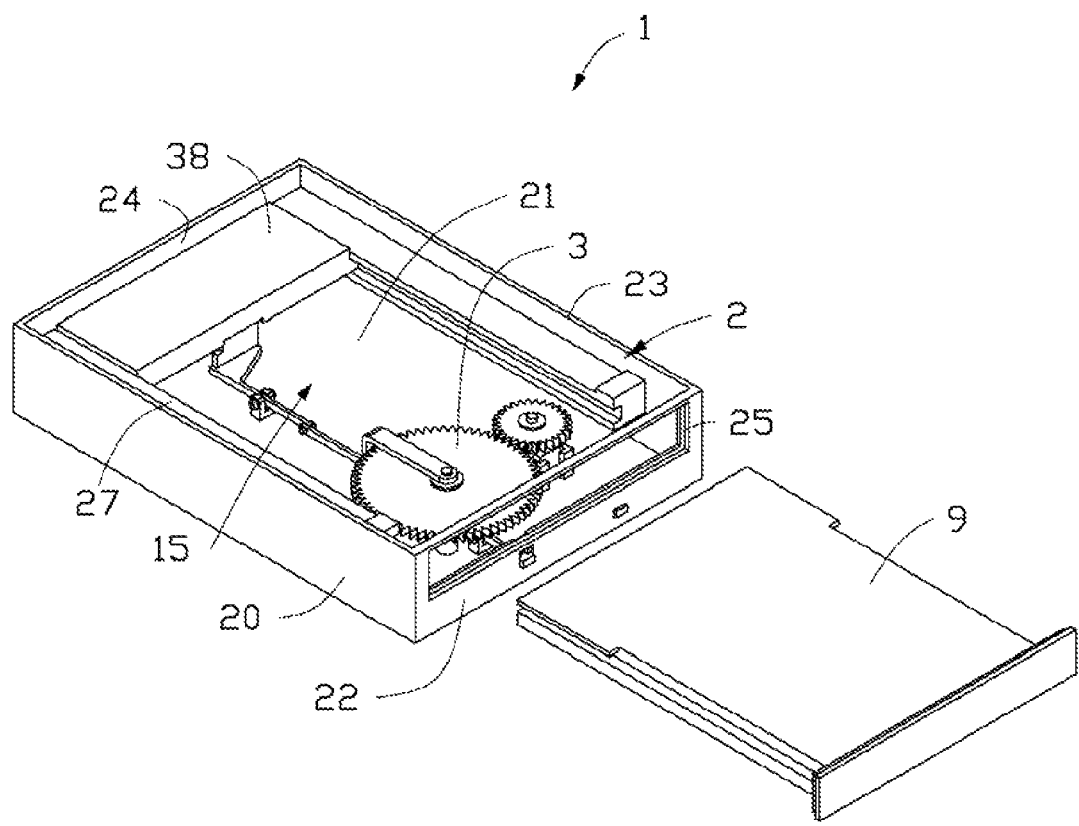
FIG. 2 is a partly exploded view of the electronic device of FIG. 1.

Referring to FIGS. 1-2, an electronic device 1 according to an embodiment of the present disclosure includes a shell 2, a sliding member 9 and a driving mechanism 3.

The shell 2 includes a bottom plate 21 and four sidewalls 20, 22, 23 and 24. The four sidewalls 20, 22, 23 and 24 extend perpendicularly from the bottom plate 21, and are specifically a first sidewall 20, a second sidewall 22, a third sidewall 23 and a fourth sidewall 24. The bottom plate 21 and the four sidewalls 20, 22, 23 and 24 cooperatively define an accommodating space 15 therebetween. The driving mechanism 3 is received in the accommodating space 15, and the sliding member 9 is movably received in the accommodating space 15.

The first sidewall 20 and the third sidewall 23 are opposite to and parallel to each other, and the second sidewall 22 adjoins the first sidewall 20 and the third sidewall 23. An opening 25 is formed at the second sidewall 22. A pair of sliding guides 27 are formed at the first sidewall 20 and the third sidewall 23, respectively. The sliding member 9 can slide along the sliding guides 27, and move into and out of the accommodating space 15 through the opening 25.

Figure 3:
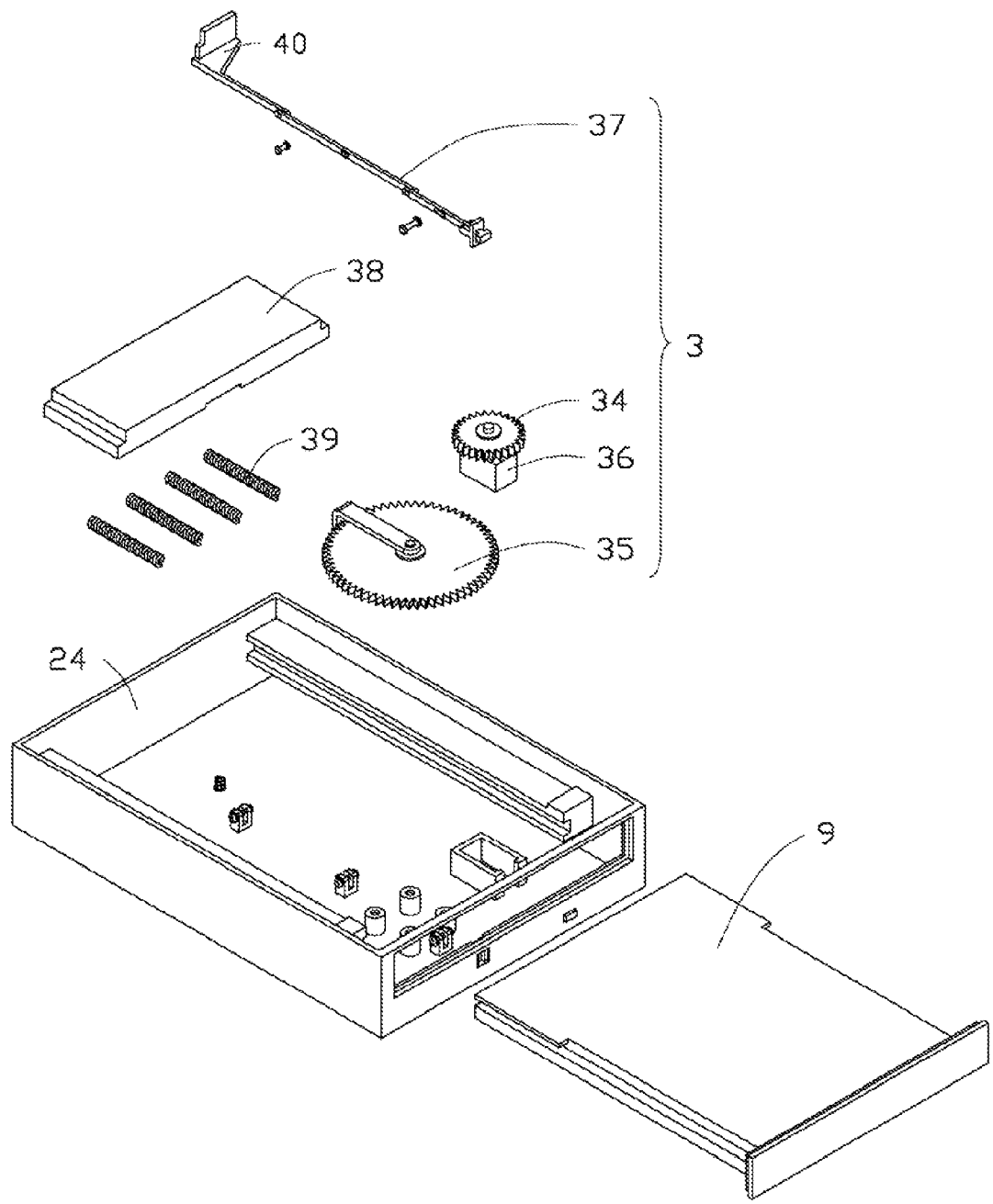
FIG. 3 is a fully exploded view of the electronic device of FIG. 1.
Figure 4:
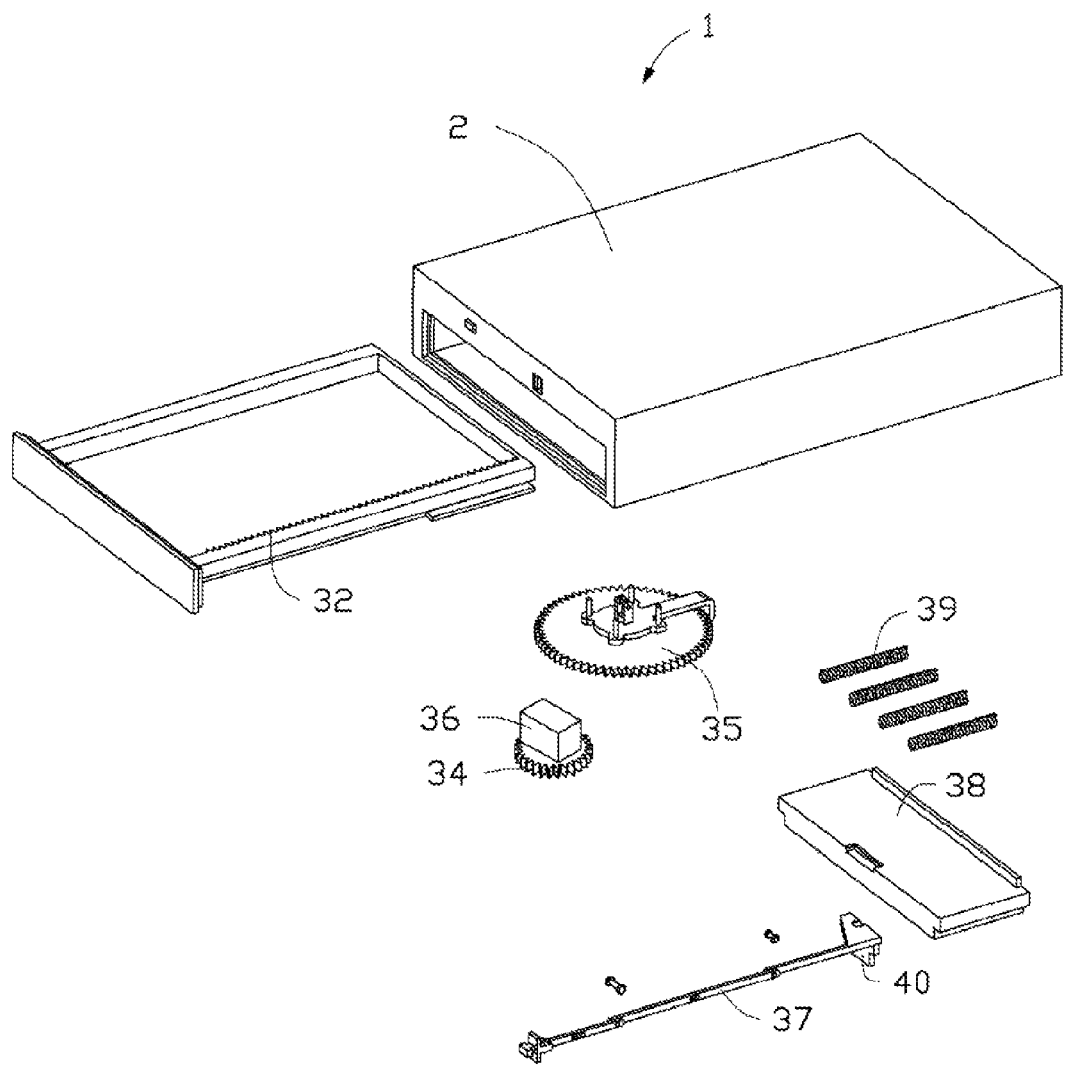
FIG. 4 is another fully exploded view of the electronic device of FIG. 1, but with the electronic device inverted.

Referring also to FIGS. 3-4, the driving mechanism 3 includes a first gear 34, a second gear 35 and a driver motor 36.

When required, the first gear 34, the second gear 35 and the driver motor 36 cooperatively drive the sliding member 9 into or out of the shell 2. Specifically, the first gear 34 engages with a driving axle of the driver motor 36, and can mesh with the second gear 35 via gear teeth provided on the first and second gears 34, 35. The first gear 34 can rotate under control of the driving axle of the driver motor 36, and thus rotate the second gear 35. At least one gear rack 32 is formed on the sliding member 9. In the illustrated embodiment, there is a single gear rack 32 on the sliding member 9. The gear rack 32 is parallel to the sliding guides 27, and includes a plurality of teeth that can mesh with the gear teeth of the second gear 35. When the first gear 34 rotates the second gear 35, the second gear 35 cooperates with the gear rack 32 to drive the sliding member 9 to move along the sliding guides 27.

More particularly, when the first gear 34 is rotated in a clockwise direction by the driver motor 36, the second gear 35 rotates counterclockwise, and the counterclockwise rotation of the second gear 35 drives the sliding member 9 out from the accommodating space 15. Conversely, when the first gear 34 is rotated in a counterclockwise direction by the driver motor 36, the second gear 35 rotates clockwise, and the clockwise rotation of the second gear 35 pulls the sliding member 9 into the accommodating space 15.

The movement of the sliding member 9 may also be controlled by other driving mechanisms. In one embodiment, the driving mechanism 3 further includes a link lever 37, a pusher 38, a position stopper 40, and a plurality of elastic members 39, as best seen in FIGS. 3-4.

Figure 5:
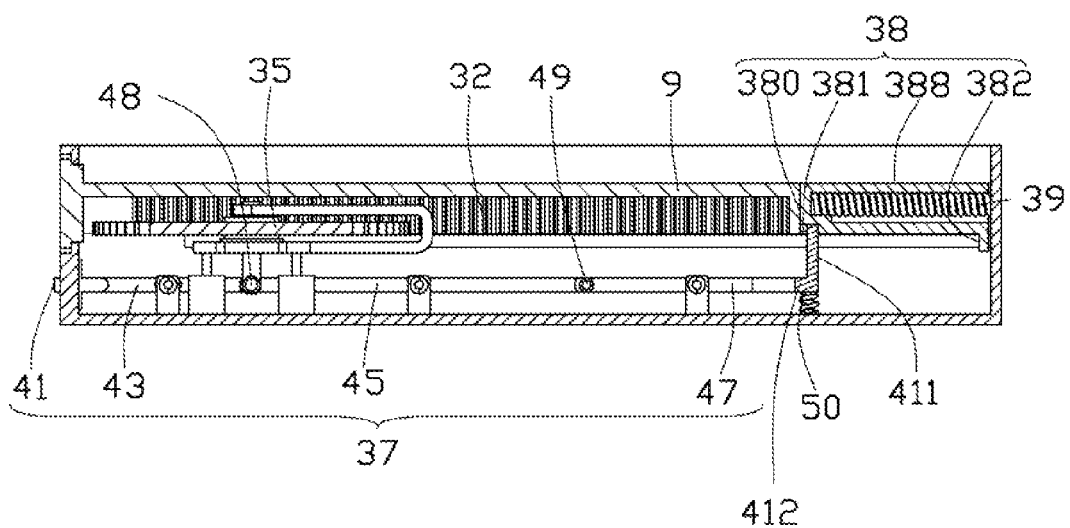
FIG. 5 is a cross-sectional view of the electronic device of FIG. 1 taken along line V-V thereof.

The link lever 37 is connected to a base (or stator portion) of the second gear 35, and controls the second gear 35 to move upwards to mesh with the gear rack 32 or move downwards to unmesh from the gear rack 32. For example, referring also to FIGS. 5-6, the link lever 37 includes a control key 41, a first connecting rod 43, a second connecting rod 45, and a third connecting rod 47. The first connecting rod 43, the second connecting rod 45 and the third connecting rod 47 are supported by the bottom plate 21 at their central portions, so as to allow pivotal movement. In particular, each of the first, second and third connecting rods 43, 45, 47 is pivotably attached to a respective knuckle (not labeled) extending up from the bottom plate 21. The control key 41 is installed onto a front end of the first connecting rod 43, and the other end of the first connecting rod 43 is pivotally engaged with an end of the second connecting rod 45 at a first pivot joint 48. The other end of the second connecting rod 45 is pivotally engaged with an end of the third connecting rod 47 at a second pivot joint 49, and the other end of the third connecting rod 47 is fixed with the position stopper 40. The second gear 35 is fixed to the first pivot joint 48. Under control of the control key 41, the first pivot joint 48 can push the second gear 35 to move upwards and mesh with the gear rack 32, or can pull the second gear 35 to move downwards and unmesh from the gear rack 32.

The position stopper 40 includes a connection end 412, a blocking plate 411 and an elastic member 50. The connection end 412 is connected to the other end of the third connecting rod 47. The blocking plate 411 extends perpendicularly up from an upper side of a rear of the connection end 412, and one end of the elastic member 50 is fixed to a lower side of the rear of the connection end 412. The other end of the elastic member 50 can be fixed to the bottom plate 21 of the shell 2.

The pusher 38 is hollow, and in cross-section has a generally U-shaped configuration. The pusher 38 includes a front pushing portion 380 and two parallel walls 388, namely, a lower wall 388 and an upper wall 388. The two parallel walls 388 extend perpendicularly from opposite bottom and top ends of the push portion 380 to define the U-shaped configuration.

The elastic members 39 are received substantially inside the pusher 38. One end of each of the elastic members 39 is fixed to the fourth sidewall 24 of the shell 2. A length of the hollow of the pusher 38 is less than the uncompressed length of each elastic member 39, such that the elastic member 39 is compressed when the elastic member 39 is entirely received in the hollow of the pusher 38. In particular, when the sliding member 9 is received in the accommodating space 15, the distal ends of the parallel walls 388 abut the fourth sidewall 24, and the elastic members 39 are entirely received in the hollow of the pusher 38. When the sliding member 9 moves out from the accommodating space 15 via the opening 25, the elastic members 39 decompress and substantially recover to their free lengths, and consequently only parts of the elastic members 39 are received in the hollow of the pusher 38.

The pusher 38 may further include a latching groove 381 and a latching protrusion 382. The latching groove 381 is formed at a corner between the pushing portion 380 and the lower wall 388. The latching protrusion 382 protrudes down from a distal end of the lower wall 388 toward the bottom plate 21. When the sliding member 9 is received in the accommodating space 16, the blocking plate 411 of the position stopper 40 latches in the latching groove 381, to help keep the pusher 38 in position despite the elastic members 39 being under compression. When the sliding member 9 moves out a maximum distance from the accommodating space 15, the latching protrusion 382 latches on the blocking plate 411 of the position stopper 40, thereby preventing the sliding member 9 from moving out beyond the maximum distance.

Figure 6:
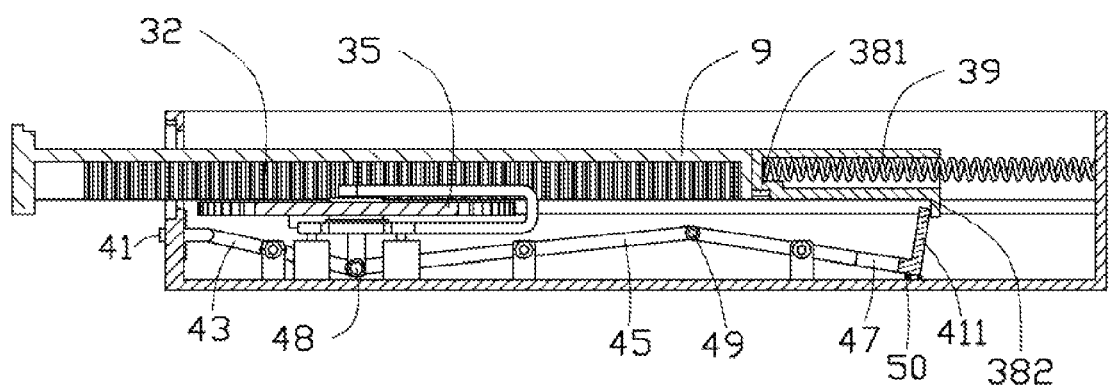
FIG. 6 is similar to FIG. 5, but showing the sliding member ejected partly out from the shell.

In operation, when the sliding member 9 is to be ejected from the shell 2, as indicated in FIG. 6, a user pulls the control key 41 up to make the first connecting rod 43 tilt clockwise, and accordingly the first pivot joint 48 between the first connecting rod 43 and the second connecting rod 45 moves downwards to unmesh the second gear 35 from the gear rack 32. As the first pivot joint 48 descends, the second connecting rod 45 tilts counterclockwise and the second pivot joint 49 (between the second connecting rod 45 and the third connecting rod 47) moves upwards, which causes the third connecting rod 47 to tilt clockwise. Thus, the position stopper 40 connected to the distal end of the third connecting rod 47 move downwards, and the blocking plate 411 unlatches from the latching groove 381 and the elastic member 50 is compressed. When the blocking plate 411 is unlatched, the elastic members 39 are able to recover from their compressed states, and so the pusher 38 pushes the sliding member 9 to slide along the sliding guides 27 and out via the opening 25. When the sliding member 9 has moved out to the maximum distance, the latching protrusion 382 latches on the blocking plate 411 to prevent further movement of the sliding member 9.

When the sliding member 9 is not required for use, the sliding member 9 can be wholly received in the shell 2. The user may manually push the sliding member 9 into the shell 2. When the sliding member 9 is fully received in the shell 2, the distal ends of the parallel walls 388 of the pusher 38 come into contact with the fourth sidewall 24, and the latching groove 381 becomes aligned with the blocking plate 411. Thus the elastic member 50 is able to recover, and pushes the blocking plate 411 into the latching groove 381. The sliding member 9 is thus latched inside the shell 2.

Figure 7:
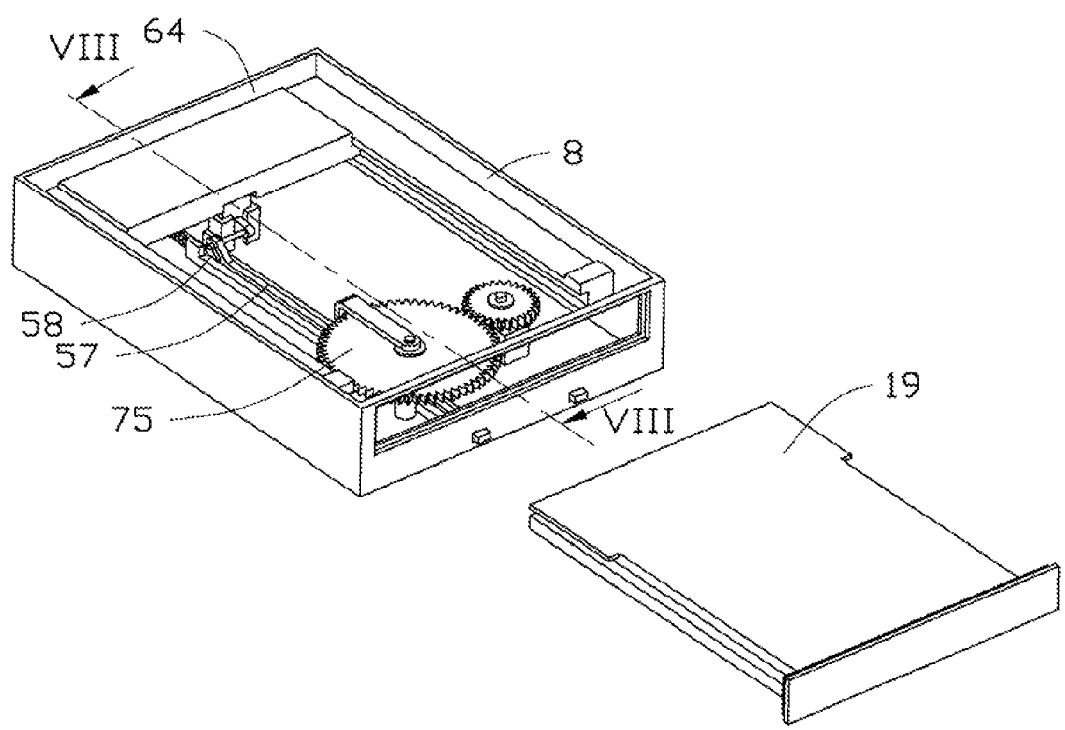
FIG. 7 is an isometric, partly exploded view of an electronic device according to another embodiment of the present disclosure, the electronic device including a shell and a sliding member.
Figure 8:
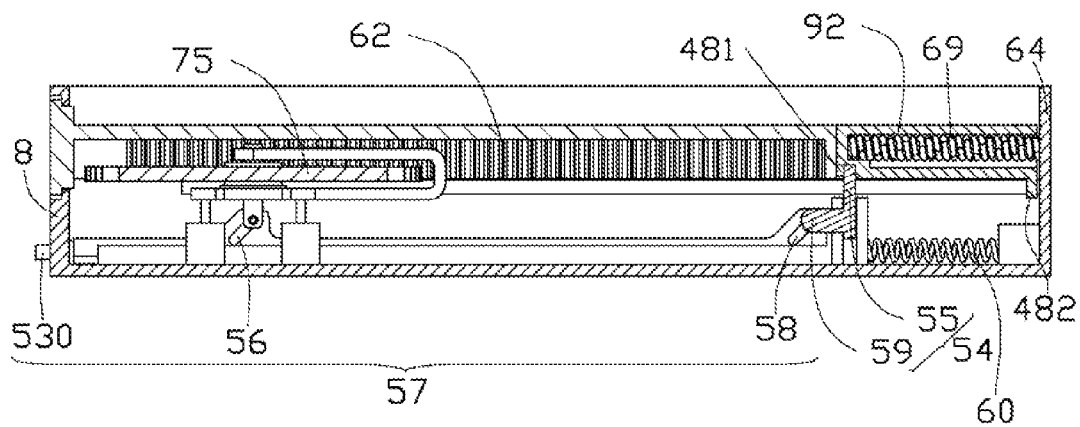
FIG. 8 is a cross-sectional view of the electronic device of FIG. 7 when the sliding member is received in the shell, corresponding to line VIII-VIII thereof.

The driving mechanism 3 of the electronic device 1 is just one example, and other configurations include the following example. Referring to FIGS. 7-8, an alternative electronic device includes a shell 8, a sliding member 19 and a driving mechanism. The driving mechanism includes a link lever 57, a position stopper 54, a pusher 92 and a plurality of elastic members 69.

The link lever 57 includes a first flange (not labeled) for engaging with a gear 75, and an opposite second flange (not labeled) for engaging with the position stopper 54. A first sliding groove 56 is formed at the first flange, with the first sliding groove 56 inclined relative to a main elongated body of the link lever 57. A second sliding groove 58 is formed at the second flange, with the second sliding groove 58 inclined relative to the main elongated body of the link lever 57 and parallel to the first sliding groove 56. The position stopper 54 includes a blocking plate 55 and a connection end 59. A base (or stator portion) of the gear 75 is slidably engaged in the first sliding groove 56. When the sliding member 19 is received in a shell 8, the base of the gear 75 is located at an upper end of the first sliding groove 56. Similarly, the connection end 59 of the position stopper 54 is slidably engaged in the second sliding groove 58. When the sliding member 19 is received in the shell 8, the position stopper 54 is located at an upper end of the second sliding groove 58. An elastic member 60 may be connected between a rear end of the link lever 57 and a sidewall 64 of the shell 8.

When the sliding member 19 is received in the shell 8, the blocking plate 55 of the position stopper 54 is received in a latching groove 481 of a pusher 92. To eject the sliding member 19 from the shell 8, a user may press a control key 530 installed at a front end of the link lever 57, to exert a push force on the link lever 57. Thereby, the link lever 57 slides rearward, the base of the gear 75 is driven to slide vertically down and become positioned in a lower end of the first sliding groove 56, the connection end 59 of the position stopper 54 is driven to slide vertically down and become positioned in a lower end of the second sliding groove 58, and the elastic member 60 is compressed by the link lever 57. Accordingly, the gear 75 is unmeshed from a gear rack 62 formed at the sliding member 19, and the blocking plate 55 of the position stopper 54 is released from the latching groove 481 of the pusher 92. The elastic members 69 between the pusher 92 and the sidewall 64 recover and drive the pusher 92 to push the sliding member 19 out from the shell 8 until a latching protrusion 482 of the pusher 92 latches on the blocking plate 55. In this position, a top end of the blocking plate 55 abuts a lower wall of the pusher 92. Accordingly, the blocking plate 55 prevents forward movement of the link lever 57, and the elastic member 60 remains compressed.

When the sliding member 19 is not required, the user may manually push the sliding member 19 into the shell 8. When the sliding member 19 is fully received in the shell 8, the latching groove 481 becomes aligned with the blocking plate 55. Thus the elastic member 60 is able to recover, and pushes the link lever 57 forward. Thereby, the base of the gear 75 is driven to slide vertically up and become positioned in the upper end of the first sliding groove 56, and the connection end 59 of the position stopper 54 is driven to slide vertically up and become positioned in the upper end of the second sliding groove 58. Accordingly, the gear 75 is meshed with the gear rack 62 formed at the sliding member 19, and the blocking plate 55 of the position stopper 54 is latched into the latching groove 481 of the pusher 92. The sliding member 19 is thus latched inside the shell 8.

It is to be further understood that even though numerous characteristics and advantages of preferred and exemplary embodiments have been set out in the foregoing description, together with details of the structures and functions of the embodiments, the disclosure is illustrative only; and changes may be made in detail, especially in matters of shape, size and arrangement of parts within the principles of the present disclosure to the full extent indicated by the broad general meaning of the terms in which the appended claims are expressed.

What is claimed is:

1. An electronic device, comprising:
  a shell;
  a sliding member movably received in the shell; and
  a driving mechanism comprising a link lever, a pusher, and a position stopper, the position stopper being located to a rear end of the link lever, and the pusher being latched by the position stopper when the sliding member is received in the shell;
  wherein the link lever is configured to control the position stopper to release the pusher, and the pusher is configured to thereupon eject the sliding member from the shell;
  wherein the pusher comprises a latching groove, the position stopper comprises a blocking plate, and the blocking plate is latched in the latching groove to latch the pusher when the sliding member is received in the shell.

2. The electronic device of claim 1, wherein the pusher further comprises a latching protrusion, and the latching protrusion is latched on the blocking plate when the sliding member moves to a maximum ejected distance from the shell.

3. The electronic device of claim 2, wherein the pusher further comprises a pushing portion and two parallel walls extending perpendicularly from opposite bottom and top ends of the push portion to cooperatively define a U-shaped configuration of the pusher, the latching groove is formed at a corner between the pushing portion and a bottom one of the parallel walls, and the latching protrusion protrudes from a distal end of the bottom parallel wall.

4. The electronic device of claim 3, wherein the driving mechanism further comprises one or more elastic members connected between the pushing portion and a sidewall of the shell, the one or more elastic members are compressed and received in the U-shaped configuration when the sliding member is received in the shell, and the one or more elastic members are configured to provide elastic force to enable the pusher to eject the sliding member from the shell when the pusher is released.

5. The electronic device of claim 1, wherein the link lever comprises a control key, a first connecting rod, a second connecting rod, and a third connecting rod, each of the first, second and third connecting rods is supported by a bottom plate of the shell so as to allow pivotal movement of the connecting rod, the control key is installed at a front end of the first connecting rod, the other end of the first connecting rod is pivotally engaged with an end of the second connecting rod at a first pivot joint, the other end of the second connecting rod is pivotally engaged with an end of the third connecting rod at a second pivot joint, and the other end of the third connecting rod is fixed with the position stopper.

6. The electronic device of claim 5, wherein the driving mechanism further comprises a gear, a bottom of the gear is fixed to the first pivot joint, the sliding member comprises a gear rack, and the gear is meshed with the gear rack when the sliding member is received in the shell.

7. The electronic device of claim 6, wherein when the control key is pulled up, the first pivot joint moves downwards to unmesh the gear from the gear rack, and the second pivot joint moves upwards to unlatch the position stopper from the pusher.

8. The electronic device of claim 1, wherein the sliding member comprises a gear rack, the driving mechanism further comprises a gear, the link lever comprises a first flange having a first sliding groove, and an opposite second flange having a second sliding groove, the first sliding groove and the second sliding groove are parallel to each other and both inclined relative to the link lever, a bottom of the gear is slidably engaged in the first sliding groove, the position stopper is slidably engaged in the second sliding groove, and the gear is meshed with the gear rack when the sliding member is received in the shell.

9. The electronic device of claim 8, wherein the link lever further comprises a control key installed at a front end thereof, and an elastic member is connected between a rear end of the link lever and a rear wall of the shell; and when the control key is pressed, the bottom of the gear slides down along the first sliding groove to unmesh the gear from the gear rack, the position stopper slides down along the second sliding groove to unlatch from the pusher, and the elastic member is compressed by the link lever.

10. An electronic device, comprising:
  a shell comprising sliding guides;
  a sliding member slidable along the sliding guides and thereby movable out from and into the shell; and
  a driving mechanism comprising a link lever, a pusher and a position stopper, the position stopper being located at a rear of the link lever, and the pusher being latched by the position stopper when the sliding member is received in the shell;
  wherein the link lever is configured to unlatch the position stopper from the pusher, and the pusher is configured to thereupon drive the sliding member to slide along the sliding guides and thus eject the sliding member from the shell; wherein the pusher comprises a latching groove, the position stopper comprises a blocking plate, and the blocking plate is latched in the latching groove to latch the pusher when the sliding member is received in the shell.

11. The electronic device of claim 10, wherein the pusher further comprises a latching protrusion, and the latching protrusion is latched on the blocking plate when the sliding member moves to a maximum ejected distance from the shell.

12. The electronic device of claim 11, wherein the pusher further comprises a pushing portion and two parallel walls extending perpendicularly from opposite bottom and top ends of the push portion to cooperatively define a U-shaped configuration of the pusher, the latching groove is formed at a corner between the pushing portion and a bottom one of the parallel walls, and the latching protrusion protrudes from a distal end of the bottom parallel wall.

13. The electronic device of claim 12, wherein the driving mechanism further comprises one or more elastic members connected between the pushing portion and a sidewall of the shell, the one or more elastic members are compressed and received in the U-shaped configuration when the sliding member is received in the shell, and the one or more elastic members are configured to provide elastic force to enable the pusher to eject the sliding member from the shell when the pusher is released.

14. The electronic device of claim 10, wherein the link lever comprises a control key, a first connecting rod, a second connecting rod, and a third connecting rod, each of the first, second and third connecting rods is supported by a bottom plate of the shell so as to allow pivotal movement of the connecting rod, the control key is installed at a front end of the first connecting rod, the other end of the first connecting rod is pivotally engaged with an end of the second connecting rod at a first pivot joint, the other end of the second connecting rod is pivotally engaged with an end of the third connecting rod at a second pivot joint, and the other end of the third connecting rod is fixed with the position stopper.

15. The electronic device of claim 14, wherein the driving mechanism further comprises a gear, a bottom of the gear is fixed to the first pivot joint, the sliding member comprises a gear rack, and the gear is meshed with the gear rack when the sliding member is received in the shell.

16. The electronic device of claim 15, wherein when the control key is pulled up, the first pivot joint moves downwards to unmesh the gear from the gear rack, and the second pivot joint moves upwards to unlatch the position stopper from the pusher.

17. The electronic device of claim 10, wherein the sliding member comprises a gear rack, the driving mechanism further comprises a gear, the link lever comprises a first flange having a first sliding groove, and an opposite second flange having a second sliding groove, the first sliding groove and the second sliding groove are parallel to each other and both inclined relative to the link lever, a bottom of the gear is slidably engaged in the first sliding groove, the position stopper is slidably engaged in the second sliding groove, and the gear is meshed with the gear rack when the sliding member is received in the shell.

18. The electronic device of claim 17, wherein the link lever further comprises a control key installed at a front end thereof, and an elastic member is connected between a rear end of the link lever and a rear wall of the shell; and when the control key is pressed, the bottom of the gear slides down along the first sliding groove to unmesh the gear from the gear rack, the position stopper slides down along the second sliding groove to unlatch from the pusher, and the elastic member is compressed by the link lever.

* * * * *